(12) United States Patent
Sato

(10) Patent No.: US 7,476,567 B2
(45) Date of Patent: Jan. 13, 2009

(54) MIDAIR SEMICONDUCTOR DEVICE AND MANUFACTURING METHOD OF THE SAME

(75) Inventor: Takao Sato, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 362 days.

(21) Appl. No.: 11/281,517

(22) Filed: Nov. 18, 2005

(65) Prior Publication Data

US 2006/0131731 A1    Jun. 22, 2006

(30) Foreign Application Priority Data

Nov. 22, 2004  (JP)  ............................ P2004-337775
May 23, 2005  (JP)  ............................ P2005-149504

(51) Int. Cl.
*H01L 23/48* (2006.01)
(52) U.S. Cl. ...................... 438/110; 438/113
(58) Field of Classification Search ............... 257/704, 257/723; 438/107, 113, 110
See application file for complete search history.

(56) References Cited

U.S. PATENT DOCUMENTS

| 5,821,665 | A | 10/1998 | Onishi et al. |
| 6,228,675 | B1 | 5/2001 | Ruby et al. |
| 6,713,314 | B2 | 3/2004 | Wong et al. |
| 6,856,014 | B1 * | 2/2005 | Ehmke et al. ............... 257/704 |
| 2004/0157367 | A1 | 8/2004 | Wong et al. |
| 2004/0166603 | A1 | 8/2004 | Carley |
| 2005/0104204 | A1 | 5/2005 | Kawakubo et al. |

FOREIGN PATENT DOCUMENTS

| EP | 1 071 126 | 1/2001 |
| JP | 06-283619 | 10/1994 |
| JP | 2001-068616 | 3/2001 |
| JP | 2001-110946 | 4/2001 |
| JP | 2005-109221 | 4/2005 |

OTHER PUBLICATIONS

Office Action issued by the Taiwanese Patent Office for Taiwanese Patent Application No. 094138994, and English-language Summary thereof.

* cited by examiner

*Primary Examiner*—Roy K Potter
(74) *Attorney, Agent, or Firm*—Finnegan, Henderson, Farabow, Garrett & Dunner, L.L.P.

(57) ABSTRACT

A midair semiconductor device includes a Si substrate provided with an element part on its front surface side. An opening is formed in the Si substrate in such a manner that a rear surface of the element part is exposed. The opening is provided below the element part while penetrating through the Si substrate. The front surface side of the Si substrate is sealed with a first cap part such as a Si cap such that a portion above the element part is brought into a midair state. A second cap part such as a Si cap is bonded to the rear surface side of the Si substrate so that the opening is sealed.

1 Claim, 13 Drawing Sheets

MIDAIR SEMICONDUCTOR DEVICE AND MANUFACTURING METHOD OF THE SAME

CROSS-REFERENCE TO RELATED APPLICATIONS

This application is based upon and claims the benefit of priority from the prior Japanese Patent Applications No. 2004-337775, filed on Nov. 22, 2004 and No. 2005-149504, filed on May 23, 2005, the entire contents of which are incorporated herein by reference.

BACKGROUND

1. Field of the Invention

The present invention relates to a midair semiconductor device and a manufacturing method of the same.

2. Description of the Related Art

In an FBAR (Film Bulk Acoustic Resonator) filter, a MEMS (Micro Electro Mechanical Systems), and so on, a sealing structure is adopted to protect an element part from an external influence as in the case of a normal semiconductor device. These devices need to maintain a portion above the element part in a midair state in terms of their element characteristics. For this purpose, it is necessary to use a midair sealing structure. As such a sealing structure, a conventionally used can-type package is known, but since an increase in the size of the package is inevitable, it cannot possibly meet a demand for miniaturization.

Concerning this point, a circuit element in which a front surface of a Si substrate is covered with a porous resin layer in such a manner that only a portion above an element part which functions as a SAW filter is brought into a midair state is known (See Japanese Patent Laid-open Application No. Hei 6-283619, for example). Such a sealing structure has a problem of being inferior in the formation of the midair state. Further, since the porous resin layer shows absorbency, this sealing structure has a problem that it is difficult to ensure reliability of the element part.

As another sealing structure, a structure in which a SAW chip is flip-chip connected onto a Si substrate and the outside of the SAW chip is sealed with a Si cap having a C-shaped cross section is known (See Japanese Patent Laid-open Application No. 2001-110946, for example). This sealing structure needs the Si cap having a concave shape capable of housing the SAW chip. The cost required to fabricate such a Si cap becomes a factor that increases the manufacturing cost of a package. Therefore, it cannot be said that this sealing structure is practical. Moreover, since the Si cap is bonded to the Si substrate with a resin-based adhesive, the absorbency of an adhesive layer becomes a factor which reduces reliability, similarly to the sealing structure in which the element part is covered with the resin layer.

On the other hand, in Japanese Patent Laid-open Application No. 2001-068616, a wafer package in which a micro device provided on a base substrate is sealed with a cap substrate is described. Here, by bonding sealing members which are respectively formed on peripheral edges of the base substrate and the cap substrate, a hermetically sealed space is formed around the micro device. Further, by connecting a connection via formed in the cap substrate to an electrode on the base substrate side, a wire of the micro device is drawn to the outside of the package. As materials for forming the electrode, a connection surface (contact) of the connection via, and the sealing members, Si, In, Al Cu, Ag, an alloy and a compound thereof, and so on, which can be bonded to each other, are used.

In the above-described package, in the process of bonding of the base substrate and the cap substrate, the electrode of the base substrate and the contact of the connection via of the cap substrate, and the sealing members of the base substrate and the cap substrate need to be bonded simultaneously. Hence, there is a possibility that the electrical reliability between the electrode and the connection via, or the hermeticity of the sealed space deteriorates depending on the forming materials and bonding conditions. As just described, the conventional midair semiconductor devices have a problem that the connection reliability for the electrode of the element part and the hermeticity of the sealed space tend to deteriorate. Further, any of the conventional sealing structures has a disadvantage of being incapable of tuning from the rear surface side of the element part.

SUMMARY

A midair semiconductor device according to an aspect of the present invention comprises: an element structure part which includes a semiconductor substrate, an element part provided on a front surface side of the semiconductor substrate, and an opening formed penetrating through the semiconductor substrate in such a manner that a rear surface of the element part is exposed; a first cap part which seals the front surface side of the semiconductor substrate such that a portion above the element part is brought into a midair state; and a second cap part which seals the opening from a rear surface side of the semiconductor substrate.

A midair semiconductor device according to another aspect of the present invention comprises: an element structure part which includes a semiconductor substrate, an element part provided on a front surface side of the semiconductor substrate, an electrode part provided on the front surface side of the semiconductor substrate and connected to the element part, a connection plug connected to the electrode part while penetrating through the semiconductor substrate, an external connection terminal provided on a rear surface side of the semiconductor substrate so as to connect with the connection plug, and an element-side metal sealing part formed on the front surface side of the semiconductor substrate so as to surround a periphery of the element part; and a cap part which includes a cap substrate with which sealing is made such that a portion above the element part is brought into a midair state, and a cap-side metal sealing part formed on the cap substrate so as to be in contact with the element-side metal sealing part.

A midair semiconductor device according to still another aspect of the present invention comprises: an element structure part which includes a semiconductor substrate, an element part provided on a front surface side of the semiconductor substrate, an electrode part provided on the front surface side of the semiconductor substrate and connected to the element part, and an element-side metal sealing part formed on the front surface side of the semiconductor substrate so as to surround a periphery of the element part; and a cap part which includes a cap substrate with which sealing is made such that a portion above the element part is brought into a midair state, a connection plug formed penetrating the cap substrate in a position in contact with the electrode part, an external connection terminal provided on a surface of a side opposite to a surface facing the element part of the cap substrate and connected to the connection plug, and a cap-side metal sealing part formed on the cap substrate so as to be in contact with the element-side metal sealing part, wherein the electrode part and the element-side metal sealing part include a first metal material of the same kind, and a connection surface of the connection plug and the cap-side metal sealing part include a second metal material of the same kind which constitutes a low-melting metal in combination with the first metal material.

A manufacturing method of a midair semiconductor device according to yet another aspect of the present invention comprises: forming a plurality of element parts on a front surface side of a semiconductor substrate; bonding a plurality of individually separated cap parts to the semiconductor substrate, respectively, in such a manner that the plurality of element parts are sealed individually; bonding the semiconductor substrate to a support substrate via a resin protectant which absorbs irregularities caused by the plurality of cap parts; machining a rear surface of the semiconductor substrate bonded to the support substrate; and cutting the machined semiconductor substrate according to the plurality of element parts and fabricating a midair semiconductor device in which the element part is sealed with the cap part.

DETAILED DESCRIPTION

Hereinafter, embodiments of the present invention will be described with reference to the drawings. It should be noted that although the embodiments of the present invention will be described based on the drawings, the drawings are provided for illustrative purpose, and the present invention is not limited to the drawings.

Figure 1:
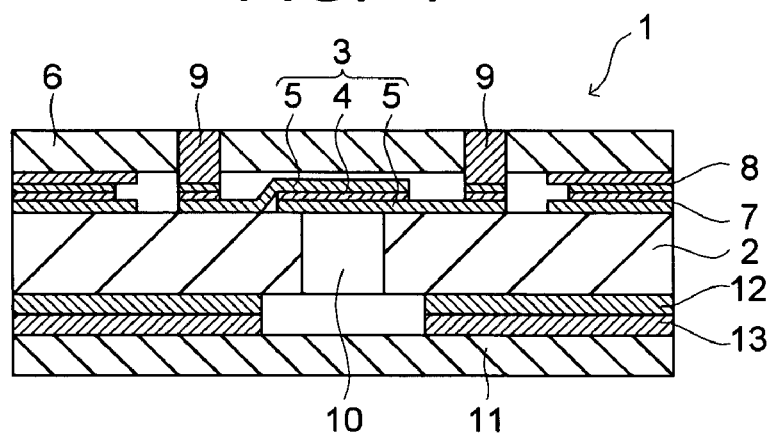
FIG. 1 is a sectional view showing a structure of a midair semiconductor device according to a first embodiment of the present invention

FIG. 1 is a sectional view showing a structure of a midair semiconductor device according to a first embodiment of the present invention. A midair semiconductor device 1 shown in FIG. 1 includes a Si substrate 2 as an element semiconductor substrate. An element part 3 is formed on a front surface of the Si substrate 2. Examples of the element part 3 are a SAW filter, an FBAR filter, a MEMS, and so on, a portion thereabove being required to be in a midair state. These compose an element structure part. FIG. 1 shows the midair semiconductor device 1 including the FBAR filter formed by sandwiching a piezoelectric film (AlN orientation film or the like) 4 between an upper and lower electrodes 5 as the element part 3. The element part 3 may be the SAW filter, the MEMS, or the like composed of the piezoelectric film.

The front surface side of the Si substrate 2 is sealed with a first cap part 6. The first cap part 6 is composed of a semiconductor substrate such as a Si substrate. The first cap part (Si cap) 6 is bonded to the Si substrate 2 by a sealing part 7 provided on the Si substrate 2 and a sealing part 8 provided on the first cap part 6 in such a manner that a portion above the element part 3 is brought into a midair state. Conductors 9, for example, provided penetrating through the first cap part 6 are bonded to the electrodes 5 of the element part 3. These conductors each function as an external connection terminal. The specific structure of the conductor 9 as the external connection terminal can be made the same as in later-described embodiments.

The Si substrate 2 has an opening 10. The opening 10 is provided under the element part 3, penetrating through the Si substrate 2 such that a rear surface of the element part 3 is exposed. By such an opening 10, the element part 3 can be tuned from the rear surface side. The opening 10 is sealed with a second cap part 11 bonded to the rear surface side of the Si substrate 2. Similarly to the first cap part 6, the second cap part 11 is formed by the cap semiconductor substrate such as the Si substrate, and bonded to the Si substrate 2 by sealing parts 12 and 13 which are provided on the Si substrate 2 and the second cap part 11, respectively. It is desirable to use a metal sealing part as each of the sealing parts 7, 8, 12, and 13 for the purpose of obtaining a hermetic sealing performance.

The above-described midair semiconductor device 1 is fabricated, for example, in the following manner. First, Au films, for example, with a thickness between 1 μm and 5 μm as the sealing parts 7 and 12 are formed on a front and rear surfaces of the Si substrate 2 (for example, 150 μm in thickness), on which the element part 3 is formed, by a plating method, a sputtering method, a deposition method, or the like, and patterned. The Au film is formed on the Si substrate 2, for example, with a barrier metal layer not shown therebetween. Then, the opening 10 is formed in the Si substrate 2 by RIE or the like from the surface on the side opposite to the surface on which the element part 3 is formed. The element part 3 is tuned from the opening 10 according to its objective characteristics.

On the other hand, a Sn film, for example, with a thickness between 1 μm and 5 μm as the sealing part 8 is formed on the Si cap (Si substrate) which becomes the first cap part 6 by the plating method, the sputtering method, the deposition method, or the like, and patterned. Similarly to the Au film, the Sn film is also formed on the surface of the Si cap 6, for example, with a barrier metal film layer not shown therebetween. The first Si cap 6 is placed and temporarily attached on the front surface side of the Si substrate 2 in such a manner that a space, for example, with a height of approximately 5 μm is formed above the element part 3. The thickness of the sealed portion to hold the first Si cap 6 in midair can be adjusted appropriately based on the thicknesses of the sealing parts 7 and 8, the thicknesses of the metal layers which become bases (for example, the barrier metal layers provided on the surfaces of the Si substrates 2 and 6), and so on.

Similarly to the first Si cap 6, a Sn film, for example, with a thickness of 1 μm as the sealing part 13 is formed also on the Si cap (Si substrate) which becomes the second cap part 11 by the plating method, the sputtering method, the deposition method, or the like, and patterned. The second Si cap 11 is placed and temporarily attached on the rear surface side of the Si substrate 2 in such a manner as to seal the opening 10 from which the element part 3 has been tuned. Thereafter, by heating a complex composed of the Si substrate 2 and the first and second Si caps 6 and 11, eutectic bonding of Au and Sn is performed. Thus, the first and second Si caps 6 and 11 are bonded to the Si substrate 2.

The above-described heating of the complex may be performed while moderate pressing force is applied using a pressing device or may be performed while pressure is applied by a weight or the like as required using a reflow furnace, a hot plate, or the like. These devices may be constructed on a wafer-level basis or may be constructed on a block-by-block basis, plural element parts 3 being lumped together as one block. Moreover, as shown in later-described embodiments, it is also possible to form the element parts 3 while the Si substrate 2 composing the element structure part is in a wafer state, and to bond each of the cap parts 6 and 11 on an element-by-element basis.

The Au film and the Sn film used for the Au—Sn eutectic bonding may be placed reversely between the Si substrate 2 and the cap parts 6 and 11, or previously alloyed Au—Sn may be used. In either case, the bonding effect does not change. Metals composing the sealing parts 7, 8, 12, and 13 are only required to be low-melting metals, and the same effect can be obtained also in the case of other low-melting metals in addition to an Au—Sn eutectic alloy. It is needless to say that an appropriate barrier metal layer or the like may be used at the time of deposition. Further, by previously providing conductors which penetrate through the first cap part 6, the external connection terminals 9 of the element part 3 can be easily formed.

In the manner described above, the structure in which the element part 3 is sealed with the first cap part 6 and the opening 10 of the Si substrate 2 is sealed with the second cap part 11 is obtained. Above the element part 3, a midair hermetically sealed space is formed by the first cap part 6 and the sealing parts 7 and 8. A portion below the element part 3 is brought into a midair state by the opening 10 sealed with the second cap part 11. Such a midair package structure makes it possible to stably obtain characteristics of the element part 3 such as the FBAR filter which needs a midair portion while maintaining sealing reliability of the element part 3.

Namely, when the FBAR filter or the like is used for the element part 3, a space to vibrate the element part 3 becomes necessary, and according to the midair package structure of this embodiment, sealed spaces can be formed above and below the element part 3. As concerns the front surface side of the Si substrate 2, after the element part 3 is formed on the Si substrate 2, the sealing part 7 is formed in a deposition process and metal-bonded to the first Si cap 6 on which the sealing part 8 is formed aside from the above, whereby the sealed space in the midair state can be easily formed. Moreover, the hermeticity of the sealed space can be improved.

As concerns the rear surface side of the Si substrate 2, after the element part 3 is formed, the opening 10 is formed, for example, by RIE, whereby tuning from the opening 10 can be performed according to the characteristics of the element part 3. Further, similarly to the front surface side of the Si substrate 2, the opening 10 can be certainly sealed by metal-bonding the second Si cap 11 on which the sealing part 13 is formed. On this occasion, unlike resin sealing, the opening 10 can be sealed in a state where the space below the element part 3 is maintained without the opening 10 being filled. Incidentally, even if the opening 10 is formed by wet etching, laser machining, or the like, instead of the above-described RIE, the effect does not differ.

By applying metal sealing (bonding) by Au—Sn eutectic solder or the like, the bonding between the Si substrate 2 and the first and second cap parts 6 and 11 can be performed by a relatively low-temperature device using a commonly used material which is easy to obtain. Accordingly, an expensive and special facility is not needed. Further, after the Au—Sn eutectic alloy is formed, sealing is strong because of metal bonding, thereby yielding the package structure resistant to impregnation with water which is feared in the case of resin or the like. Furthermore, the problem of gas in an environment around the element, which is feared in the case of resin or the like, is eliminated.

Moreover, in the semiconductor device 1 having the above-described midair package structure, the Si substrate is applied to a component including the cap parts 6 and 11, whereby the thermal expansion coefficient can be made uniform with respect to temperature change. Consequently, the structure which is resistant to deformation such as warpage can be obtained. Since at the time of bonding, the rear surface of the opening 10 is covered with the second Si cap 11 after the element part 3 having low strength is protected by the first Si cap 6, the structure which is also resistant to compressive force can be obtained.

Figure 2:
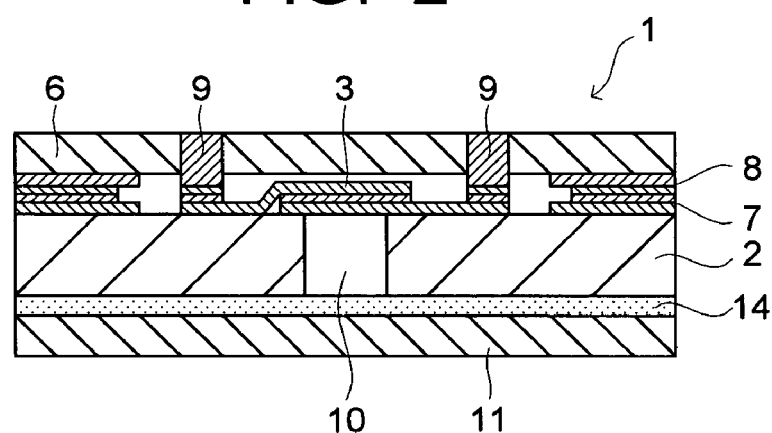
FIG. 2 is a sectional view showing a modified example of the midair semiconductor device shown in FIG. 1.
Figure 3:
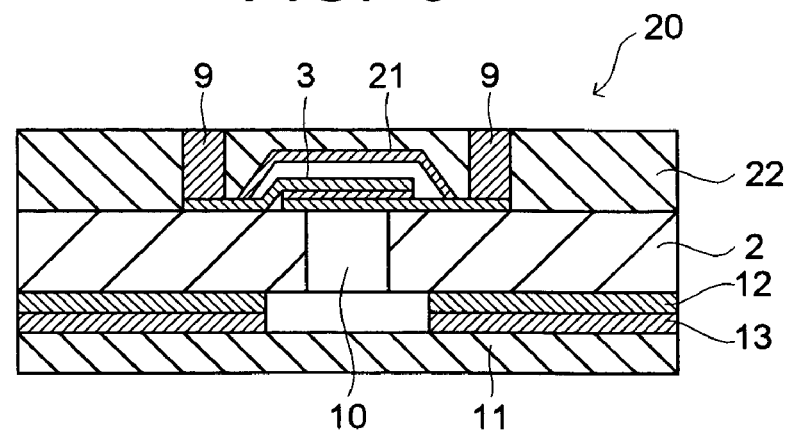
FIG. 3 is a sectional view showing a structure of a midair semiconductor device according to a second embodiment of the present invention.

Here, as shown in FIG. 2, the rear surface side of the Si substrate 2 may be sealed with a resin film 14. The resin film 14 is previously laminated on the second Si cap 11, and these resin film 14 and second Si cap 11 are laminated on the rear surface side of the Si substrate 2. As just described, also by applying a laminate of the resin film 14 to sealing of the opening 10, unlike general resin sealing, the space formed by the opening 10 can be secured without the whole opening being filled.

Since the resin film 14 used for sealing the opening 10 is excellent in thickness accuracy, flatness after lamination and thickness accuracy of the whole package can be improved. On the other hand, for example, the thickness of the Si cap 11 and the resin film 14 can be formed as thin as 100 μm or less, and hence the total thickness of the package can be reduced. The resin film 14 can obtain a structure resistant to the entry of water from the opening 10 by applying a dense structure with low moisture absorbency, a structure on which metal foil is pasted in place of the Si cap 11, or the like. The lamination of the resin film 14 may be performed by a commercially available laminater.

Next, a second embodiment of the present invention will be described with reference to FIG. 3 to FIG. 6. A midair semiconductor device 20 of the second embodiment shown in FIG. 3 includes the Si substrate 2 on the front surface of which the element part 3 is formed as in the first embodiment. The structure of the element part 3 is the same as that in the first embodiment. The opening 10 is provided in the Si substrate 2 in such a manner that the rear surface of the element part 3 is exposed, and this opening 10 is sealed with the Si cap 11. Eutectic bonding by Au—Sn eutectic solder or the like is applied to the bonding between the Si substrate 2 and the Si cap 11 as in the first embodiment.

A midair-structured dome part 21 formed by a thin film process is placed around the element part 3 formed on the front surface side of the Si substrate 2. Namely, the element part 3 is covered with the thin film dome 21 having a midair structure with a height of approximately 5 μm. Such a thin film dome 21 is formed, for example, in the following manner. First, after the element part 3 is covered with a sacrificial layer, for example, made of a photoresist, a stacked film, for example, of a Ti film and an Au film is formed on the surface thereof. After the Ti/Au film is formed by deposition or the like, the Au film is formed at a thickness of approximately several mu-meters by plating or the like. Thereafter, by removing the sacrificial layer, for example, from the opening 10, the midair-structured thin film dome 21 can be obtained.

In the midair semiconductor device 20 of the second embodiment, the whole front surface of the Si substrate 2 including the front surface of the thin film dome 21 is covered with a sealing resin 22 since the strength is low if only the thin film dome 21 is provided. As just described, a strong and smooth sealing structure can be obtained by sealing the element part 3 with the thin film dome 21 and the sealing resin 22 on a wafer-level basis or on a block-by-block basis, plural elements being lumped together as one block. In a sealing surface made of the sealing resin 22, electrodes are previously embedded or posts, for example, made of Cu are formed in a deposition process to be used as the external connection terminals 9.

Figure 4:
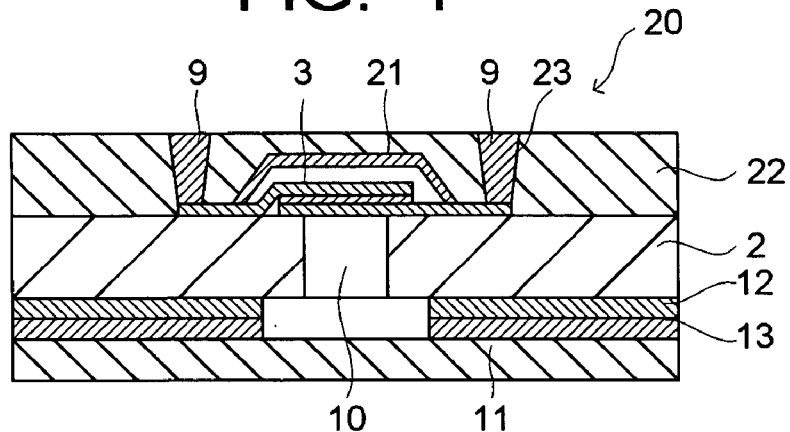
FIG. 4 is a sectional view showing a modified example of the midair semiconductor device shown in FIG. 3.
Figure 5:
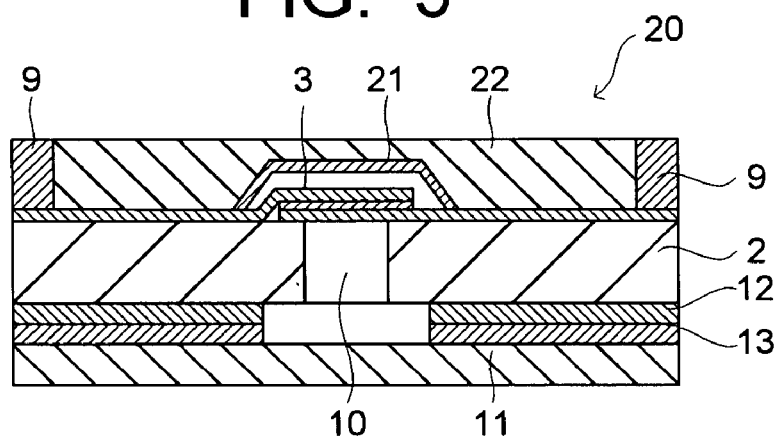
FIG. 5 is a sectional view showing another modified example of the midair semiconductor device shown in FIG. 3.

Moreover, as shown in FIG. 4, also by forming openings 23 for taking out the electrodes in the sealing resin 22 and embedding conductors such as conductive pastes in the openings 23, the external connection terminals 9 can be formed. As shown in FIG. 5, the external connection terminals 9 can be placed at ends of the device. Used as the external connection terminals 9 shown in FIG. 5 are the conductors which are placed at positions where cutting is performed when separation into individual devices is finally performed, and the external connection terminals 9 are exposed at the time of dicing. As just described, the external connection terminals 9 can be formed by various methods.

According to the midair semiconductor device 20 of the second embodiment, the thin film dome 21 is placed above the element part 3, whereby a space (for example, a space with a height of approximately 5 μm from the element part 3) necessary for the sealing structure of the element part 3 can be secured. Although the strength of the thin film dome 21 itself is low, the strength can be increased by covering its periphery with the sealing resin 22. In a resin sealing process, by providing the sacrificial layer under the thin film dome 21, the shape of the thin film dome 21 can maintained against the pressure at the time of sealing. By removing the sacrificial layer from the opening 10 provided in the Si substrate 2, for example, by a dry etching method after the outer periphery of the thin film dome 21 is hardened by the sealing resin 22, a space can be formed between the element part 3 and the thin film dome 21.

Generally the resin is unfavorable for moisture absorption, but since the thin film dome 21 functions as a barrier, a package structure resistant to water can be obtained. Moreover, irregularities are alleviated by performing planarization with the sealing resin 22. As in the first embodiment, on the rear surface side of the Si substrate 2, the opening 10 formed by RIE, wet etching, laser machining, or the like is sealed with the Si cap 11. The opening 10 is sealed in a state where the space below the element part 3 is maintained. Consequently, the midair semiconductor device 20 which enables a stable operation of the element part 3 (FBAR filter, for example) in addition to an increase in sealing reliability of the element part 3 can be provided.

Figure 6:
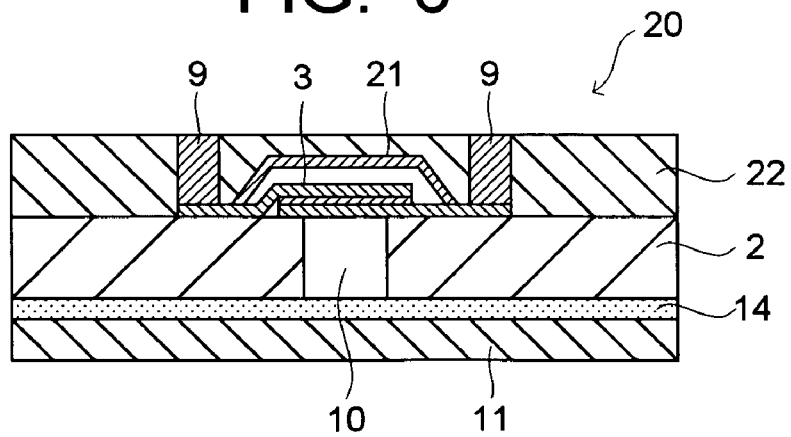
FIG. 6 is a sectional view showing still another modified example of the midair semiconductor device shown in FIG. 3.
Figure 7:
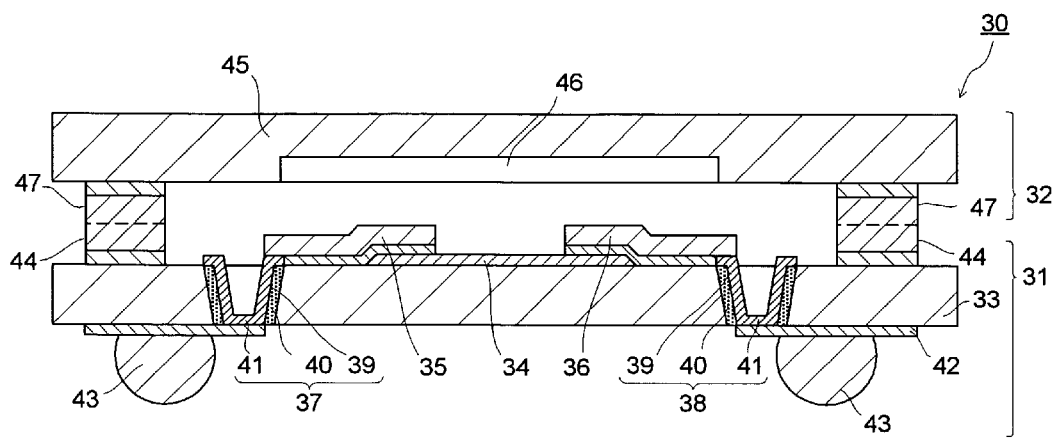
FIG. 7 is a sectional view showing a structure of a midair semiconductor device according to a third embodiment of the present invention.

As in the first embodiment, the resin film 14 can be applied to the sealing structure of the rear surface side of the Si substrate 2. FIG. 6 shows the midair semiconductor device 20 in which the Si cap 11 on which the resin film 14 is previously laminated is bonded to the rear surface side of the Si substrate 2 so as to seal the opening 10. The resin film 14 can obtain a structure resistant to the entry of water from the opening 10 by applying a dense structure with low moisture absorbency, a structure on which metal foil is pasted in place of the Si cap 11, or the like. As described above, the resin film 14 can improve flatness after lamination and thickness accuracy of the whole package, and further reduce the total thickness of the package.

Next, a third embodiment of the present invention will be described with reference to FIG. 7 to FIG. 14. A midair semiconductor device 30 of the third embodiment shown in FIG. 7 includes an element structure part 31 and a cap part 32. The element structure part 31 includes a Si substrate 33 as an element semiconductor substrate, and an element part 34 is formed on a front surface of the Si substrate 33. As an example of the element part 34, a filter element such as an FBAR filter or a MEMS a portion above which must be in a midair state is shown.

Electrodes 35 and 36 are connected to the element part 34. These electrodes 35 and 36 are each composed, for example, of a stacked film of a barrier metal layer and a Cu plating layer formed on the Si substrate 33. In the Si substrate 33 including the element part 34, connection plugs 37 and 38 are provided as through electrodes. The connection plugs 37 and 38 each have a conductor layer (Cu layer, for example) 41 which is formed in a through hole 39 provided in the Si substrate 33 with an insulating film such as a Si oxide film 40 therebetween. The throughhole 39 may be filled with the conductor layer 41.

Figure 8:
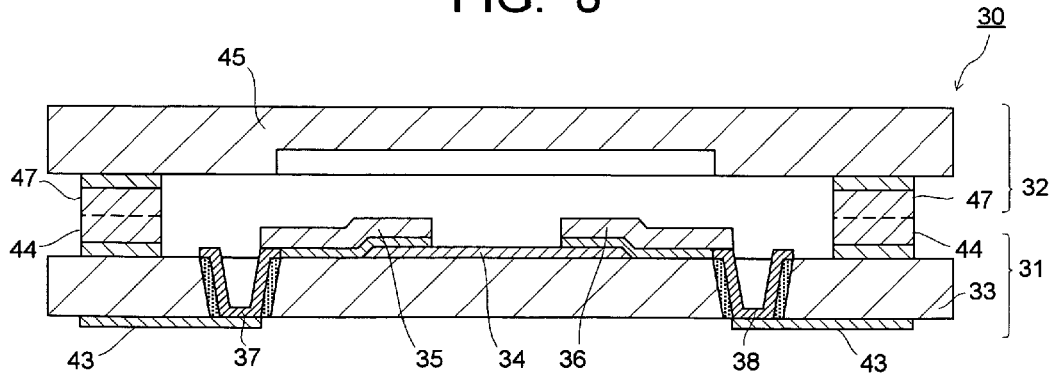
FIG. 8 is a sectional view showing a modified example of the midair semiconductor device shown in FIG. 7.

Solder bump as external connection terminals 43 are each provided on the rear surface side of the Si substrate 33 with a wiring layer (Cu layer, for example) 42 therebetween. As shown in FIG. 8, the external connection terminal 43 may be a land formed by an Au plated layer or the like. Namely, the midair semiconductor device 30 can be applied to either a BGA structure or an LGA structure. Moreover, wiring using the wiring layer 42 as a connection pad for wire bonding is also possible.

The electrodes 35 and 36 provided on the front surface side of the Si substrate 33 and the external connection terminals 43 provided on the rear surface side thereof are electrically connected via the connection plugs 37 and 38 provided as the through electrodes in the Si substrate 33. Further, on the front surface side of the Si substrate 33, an element-side metal sealing part 44 is formed so as to surround the element part 34 and the electrodes 35 and 36. A metal material (Au or Au—Sn alloy, for example) which constitutes a low-melting metal (Au—Sn eutectic alloy, for example) in combination with a later-described cap-side metal sealing part is used for the element-side metal sealing part 44. More specifically, the element-side metal sealing part 44 includes an Au layer or an Au—Sn alloy layer formed with a base metal layer such as a barrier metal layer in between. The element structure part 31 is composed of these respective components.

On the other hand, the cap part 32 includes a cap substrate 45 for sealing such that a portion above the element part 34 is brought into a midair state. The Si substrate, for example, is used as the cap substrate 45, but the cap substrate 45 is not limited to this, and a glass substrate or the like can also be used. The cap substrate 45 may have a cavity 46. On a periphery of the cap substrate 45, a cap-side metal sealing part 47 is formed at a position in contact with the element-side metal sealing part 44. By bonding the element-side metal sealing part 44 and the cap-side metal sealing part 47, the element part 34 is hermetically sealed with the cap substrate 45 so that a portion above the element part 34 is brought into the midair state.

For the above-described element-side and cap-side metal sealing parts 44 and 47, metal materials which constitute a low-melting metal based on a combination thereof are used. A typical example thereof is the above-described Au—Sn eutectic alloy. When the Au—Sn eutectic bonding is applied, for example, the element-side metal sealing part 44 is formed by an Au layer, and the cap-side metal sealing part 47 is formed by a Sn layer or an Au—Sn alloy layer. They are formed by the plating method, the sputtering method, the deposition method, or the like. Constituent materials of the metal sealing parts 44 and 47 may be reversed between the element side and the cap side, or the Au—Sn alloy layer can be used for both sides. Further, the metal materials composing the metal sealing parts 44 and 47 are not limited to the Au—Sn eutectic alloy, and, for example, a low-melting alloy whose eutectic point is approximately between 200° C. and 350° C. can be used.

In the midair semiconductor device 30 according to the third embodiment, wires of the element part 34 are drawn to the outside by the connection plugs 37 and 38 provided in the Si substrate 33 including the element part 34. Consequently, it becomes unnecessary to perform electrical connection simultaneously when the cap part 32 is bonded, which can improve both electrical connection reliability between the element part 34 and the external connection terminals 43 and the hermeticity of the sealed space formed above the element part 34.

Namely, the wires of the element part 34 are previously formed by the connection plugs 37 and 38, so that when the cap part 32 is bonded, only contact and diffusion properties between the element-side metal sealing part 44 and the cap-side metal sealing part 47 need to be considered. Accordingly, the hermeticity of the sealed space above the element part 34 can be improved while the electrical connection reliability between the element part 34 and the external connection terminals 43 is maintained. As described later, both the electrical connection reliability between the element part and the external connection terminals and the hermeticity of the sealed space above the element part can be improved also according to a fourth embodiment, but in the third embodiment, electrical connection does not need to be performed when the cap part 32 is bonded, which can further improve the electrical connection reliability and the hermeticity of the sealed space.

Figure 9A:
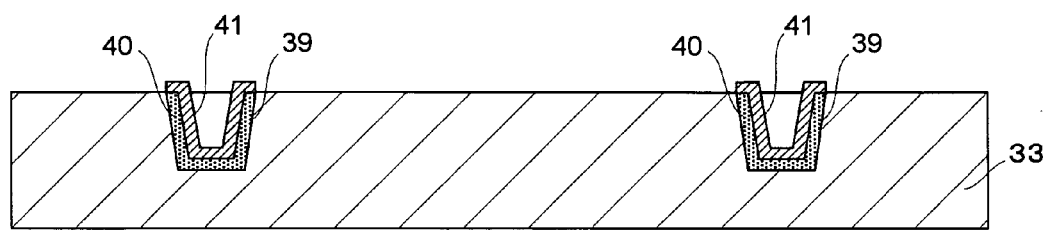
FIG. 9A, FIG. 9B, FIG. 9C, and FIG. 9D are sectional views showing a manufacturing process of the midair semiconductor device according to the third embodiment of the present invention.

The midair semiconductor device 30 according to the third embodiment is fabricated, for example, in the following manner. A manufacturing process of the midair semiconductor device 30 will be described with reference to FIG. 9A to FIG. 9D and FIG. 10A to FIG. 10C. First, as shown in FIG. 9A, recesses 39 which become connection plug forming portions are formed from the front surface side of the Si substrate 33.

An inner surface of each of the recesses 39 is oxidized to form an insulating film made of the Si oxide film 40. Further, the conductor layer 41 is formed in each of the recesses 39 by Cu plating or the like. Incidentally, a state where the recesses 39 are not filled is shown for convenience, but the recesses 39 may be filled with Cu, any other metal, or a material resistant to a temperature of approximately 350° C.

Figure 9B:
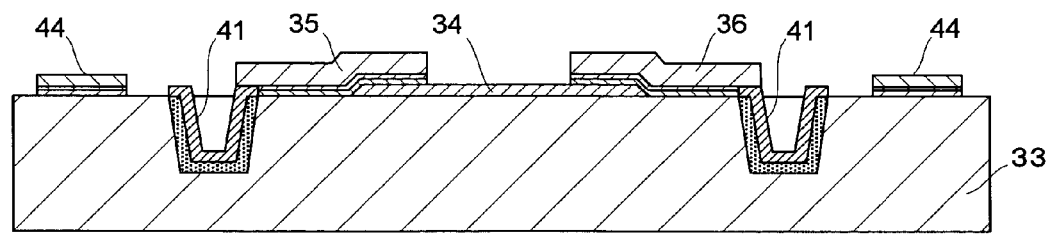

Then, as shown in FIG. 9B, the element part (element film) 34 is formed on the front surface side of the Si substrate 33, and simultaneously the electrodes 35 and 36 made of a stacked film of a base metal film (Ti or Ni) such as a barrier metal layer and a Cu conductor layer are formed. The electrodes 35 and 36 are formed in such a manner that one ends thereof are electrically connected to the element part 34 and the other ends thereof are connected to the conductor layers 41 in the recesses 39. Further, the element-side metal sealing part 44 is formed on the outer periphery side of the Si substrate 33 so as to surround the element part 34 and the electrodes 35 and 36. Here, an Au layer is formed on a base metal layer (Ti or Ni). Incidentally, an insulating film such as a Si oxide film is placed between the base metal films of the electrodes 35 and 36 and the element-side sealing part 44 and the Si substrate 33.

Figure 9C:
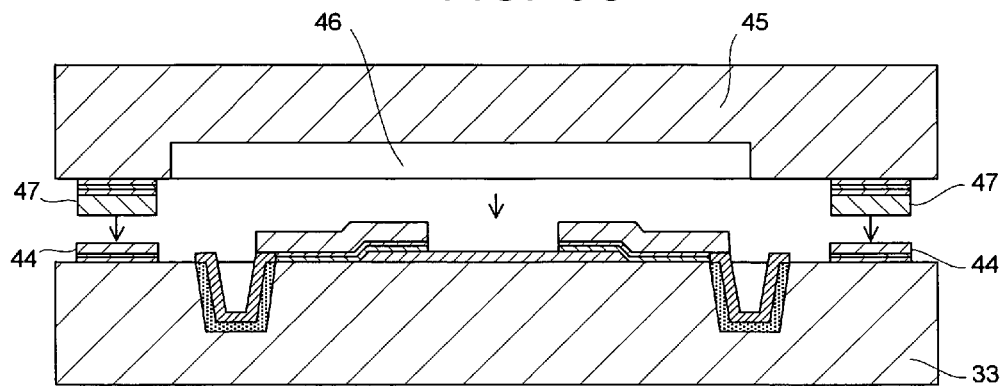

Subsequently, as shown in FIG. 9C, the cap substrate (Si cap, for example) 45 on an outer periphery of which the cap-side metal sealing part 47 is formed is prepared. Here, an Sn layer and an Au—Sn alloy layer as the cap-side metal sealing part 47 are formed on a base metal film (Ti or Ni). Such a cap substrate 45 is placed on the Si substrate 33. The cap substrate 45 is placed in such a manner that the element-side metal sealing part 44 and the cap-side metal sealing part 47 come into contact with each other. Thereafter, the cap substrate 45 is bonded to the Si substrate 33 by heating to a bonding temperature (here, Au—Sn eutectic temperature) between the element-side metal sealing part 44 and the cap-side metal sealing part 47. The element-side and cap-side metal sealing parts 44 and 47 are alloyed to form a hermetic seal 48.

The bonding by heating between the Si substrate 33 and the cap substrate 45 may be performed while a moderate pressing force is applied using a pressing device or may be performed while pressure is applied by a weight or the like as required using a reflow furnace, a hot plate, or the like. FIG. 9A to FIG. 9D and FIG. 10A to FIG. 10C show the state where one midair semiconductor device 30 is fabricated, but the Si substrate 33 and the cap substrate 45 may be bonded on a wafer-level basis or may be bonded on a block-by-block basis, plural units being lumped together as one block. Further, bonding in a state that only the cap substrate 45 is separated into individual pieces is also possible. The same bonding process can be applied to any of these processes.

Figure 9D:
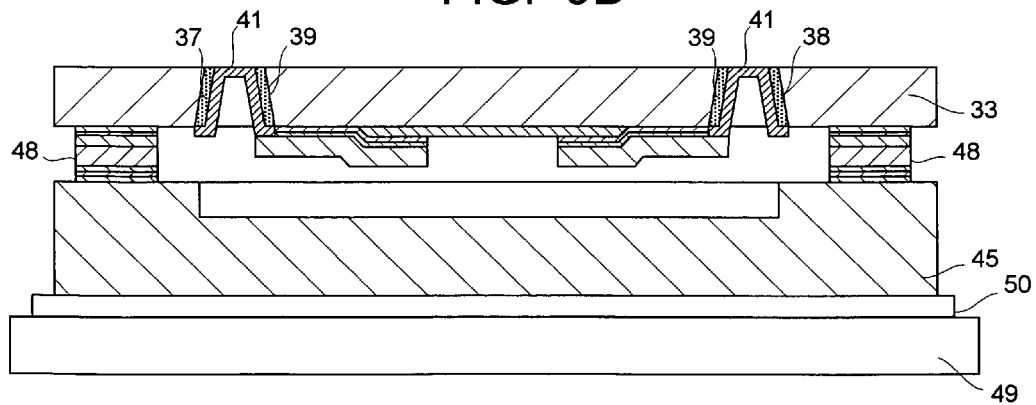
Figure 10A:
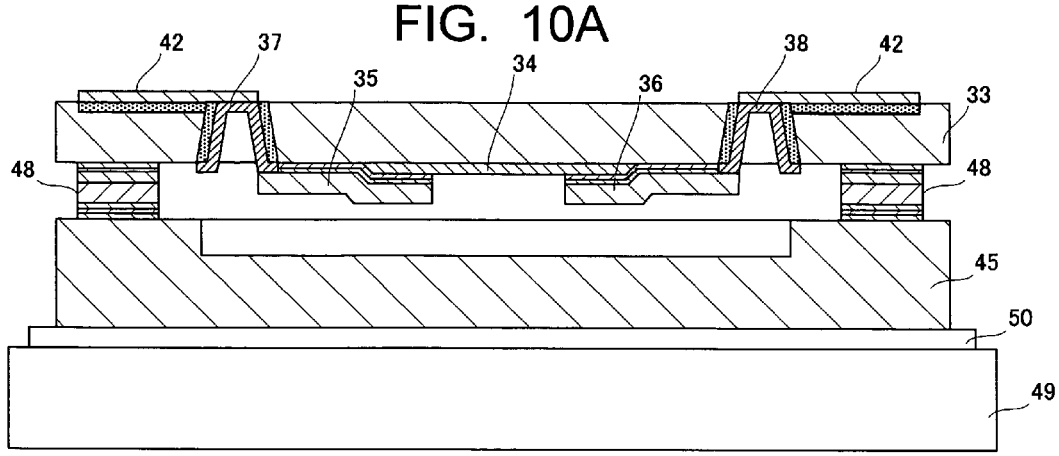
FIG. 10A, FIG. 10B, and FIG. 10C are sectional views showing the manufacturing process of the midair semiconductor device subsequent to FIG. 9D.

Then, as shown in FIG. 9D, after the cap substrate 45 is bonded to a support substrate 49 represented by a glass substrate via an adhesive 50, the rear surface side of the Si substrate 33 is ground until the conductor layers 41 in the recesses 39 are exposed. By this machining of the rear surface of the Si substrate 33, the connection plugs 37 and 38 which penetrate through the Si substrate 33 are formed. Subsequently, as shown in FIG. 10A, wiring layers 42 connected to the connection plugs 37 and 38 are deposited. When a lands is used as the external connection terminal, an Au layer or the like is formed at this stage.

Incidentally, descriptions of ordinary grinding process, lithography process, and so on are omitted. The support substrate 49 may use a resin tape material such as polyethylene terephtalate, polyolefin, or the like as a base material. Further, the cap substrate 45 which is previously ground to a predetermined thickness may be bonded to the Si substrate 33, but the above-described grinding after bonding is more favorable for preventing fracture and so on caused by handling.

Figure 10B:
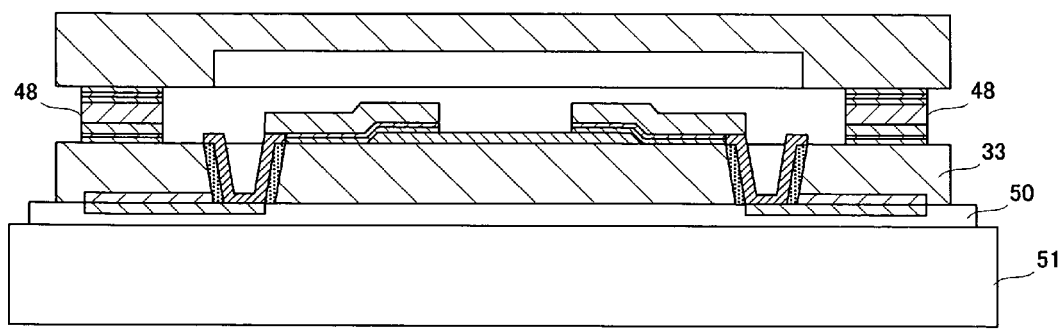

Furthermore, as shown in FIG. 10B, after the rear surface side (external connection terminal side) of the Si substrate 33 is bonded to a support substrate 51 represented by a glass substrate via the adhesive 50, a rear surface of the cap substrate 45 is finished by grinding to a predetermined thickness. When bonding is performed wafer by wafer or in plural units, blade dicing or the like is performed after finishing of the cap substrate 45, so that individual packages (midair semiconductor devices 30) are separated.

Figure 10C:
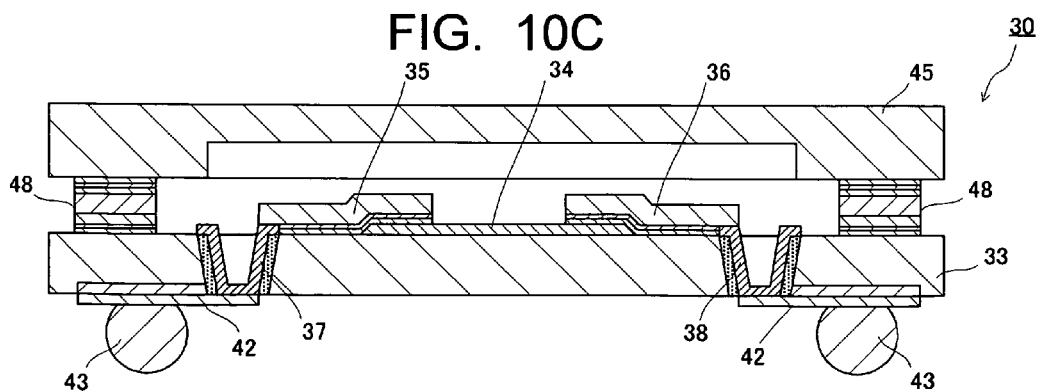

When solder bumps are used as the external connection terminals 43, as shown in FIG. 10C, the solder bumps are formed on the wiring layers 42 after both the surfaces are ground. The solder bumps 43 may be formed at the time of machining of the rear surface of the Si substrate 33 shown in FIG. 1A. Incidentally, as described above, the support substrate 51 may use a resin tape material such as polyethylene terephtalate, polyolefin, or the like as a base material.

Figure 11:
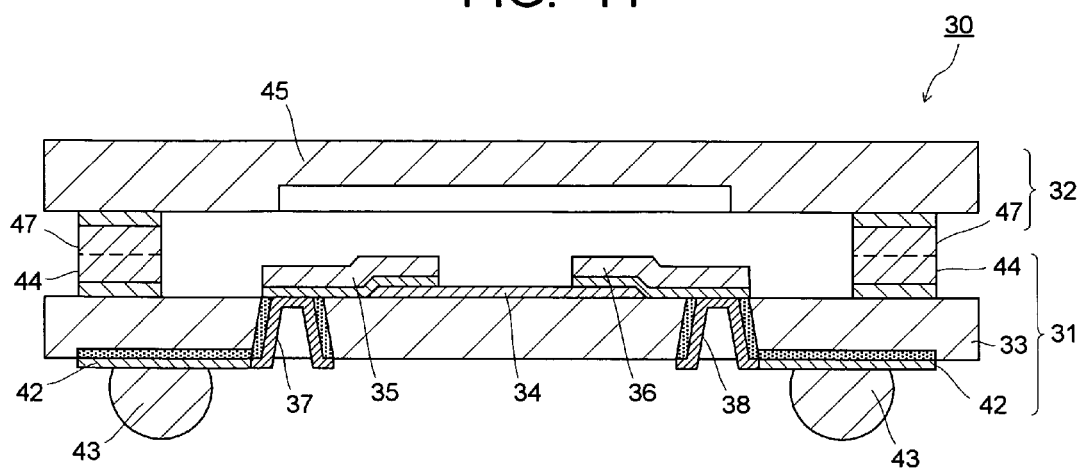
FIG. 11 is a sectional view showing another modified example of the midair semiconductor device shown in FIG. 7.
Figure 12:
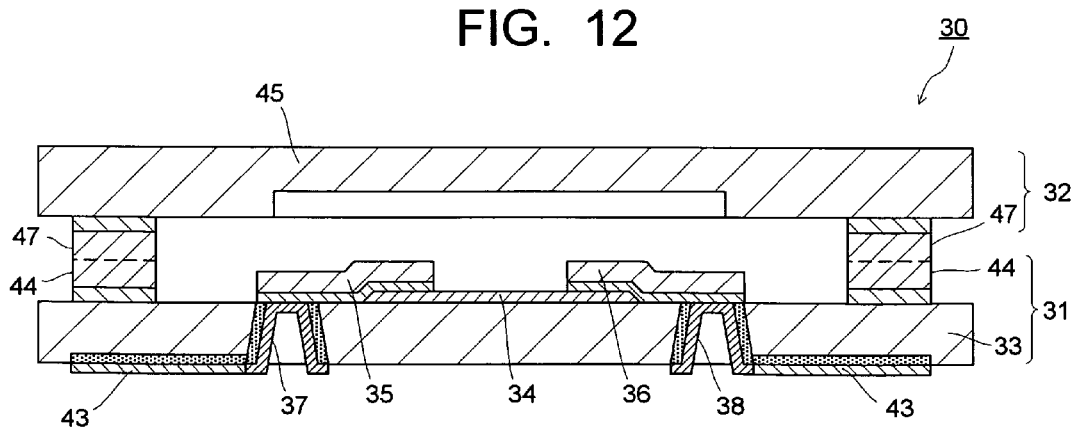
FIG. 12 is a sectional view showing still another modified example of the midair semiconductor device shown in FIG. 7.

The connection plugs 37 and 38 are not limited to those which are formed from the front surface side of the Si substrate 33. As shown in FIG. 11 and FIG. 12, the connection plugs 37 and 38 may be formed from the rear surface side of the Si substrate 33. In the connection plugs 37 and 38 in either case, the hermeticity of the sealed space above the element part 34 can be improved while the electrical connection reliability between the element part 34 and the external connection terminals 43 is maintained. Namely, both the electrical reliability and the sealing reliability of the midair semiconductor device 30 can be improved.

Figure 13A:
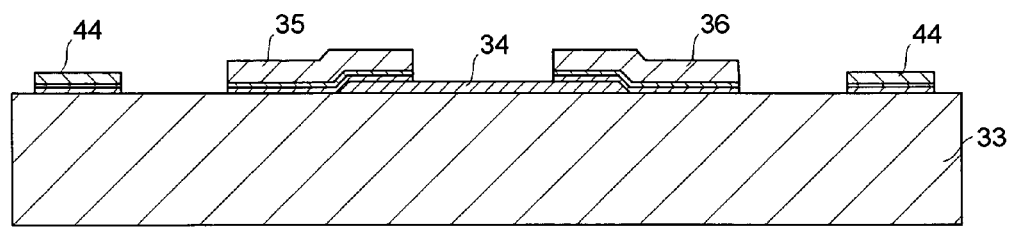
FIG. 13A, FIG. 13B, FIG. 13C, and FIG. 13D are sectional views showing a manufacturing process of the midair semiconductor device shown in FIG. 11.

A manufacturing process when the connection plugs 37 and 38 are formed from the rear surface side of the Si substrate 33 will be described with reference to FIG. 13A to FIG. 13D and FIG. 14A to FIG. 14C. First, as shown in FIG. 13A, the element part (element film) 34 and the electrodes 35 and 36 are formed on the front surface side of the Si substrate 33. Further, the element-side metal sealing part 44 is formed on the outer periphery of the Si substrate 33 so as to surround the element part 34 and the electrodes 35 and 36.

Figure 13B:
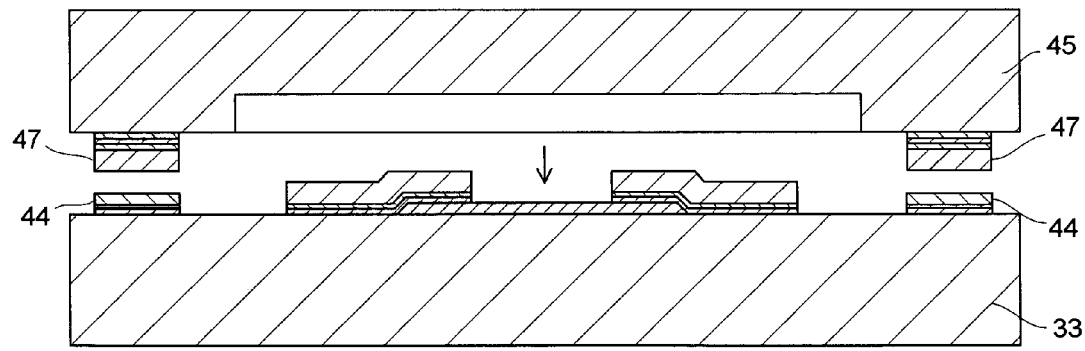

Then, as shown in FIG. 13B, the cap substrate (Si cap, for example) 45 on the outer periphery of which the cap-side metal sealing part 47 is formed is placed on the Si substrate 33 including the element part 34 and so on. The cap substrate 45 is bonded to the Si substrate 33 by heating to the bonding temperature between the element-side metal sealing part 44 and the cap-side metal sealing part 47. Incidentally, details of each process are the same as in the above-described manufacturing process.

Figure 13C:
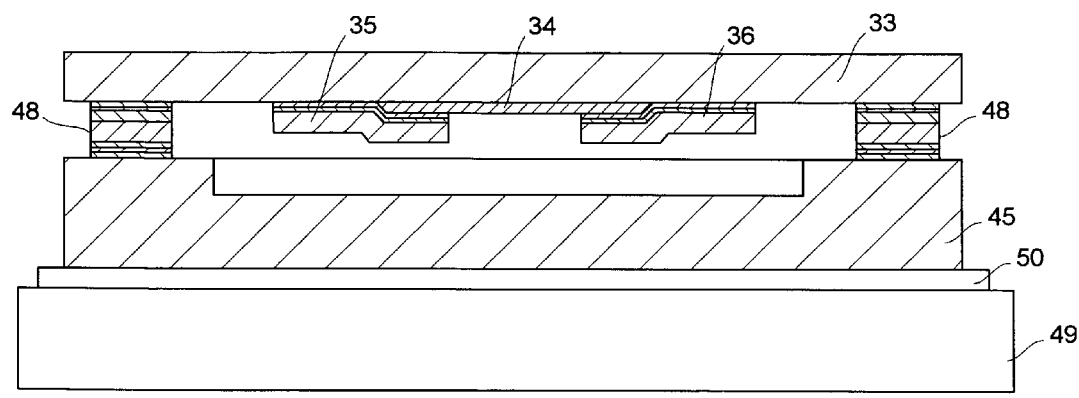
Figure 13D:
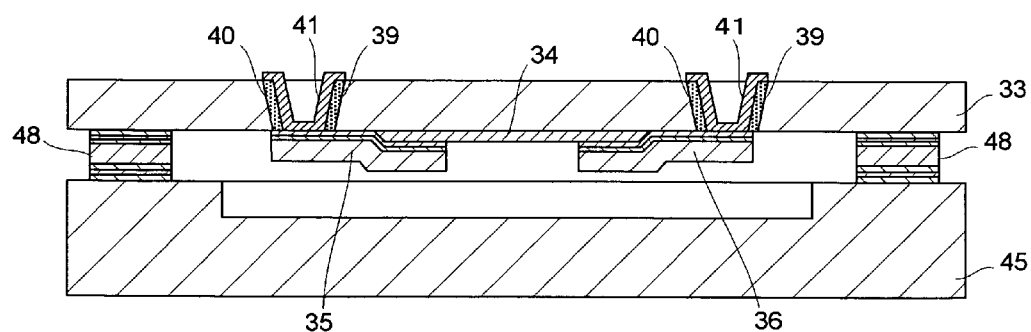

Subsequently, as shown in FIG. 13C, after the cap substrate 45 is bonded to the support substrate 49 represented by the glass substrate via the adhesive 50, the rear surface side of the Si substrate 33 is ground to a predetermined thickness. Thereafter, as shown in FIG. 13D, by subjecting the Si substrate 33, for example, to etching, the recesses 39 which become connection plug forming portions are formed from the rear surface side of the Si substrate 33. The recesses 39 are formed so as to reach the electrodes 35 and 36. Put another way, the recesses 39 are formed such that the electrodes 35 and 36 are exposed.

The inner surface of each of the recesses 39 is oxidized to form the insulating film made of the Si oxide film 40. Further, after the Si oxide film 40 existing on a bottom of each of the recesses 39 is removed, the conductor layer 41 is formed in each of the recesses 39 by Cu plating or the like. Thus, the connection plugs 37 and 38 which penetrate through the Si substrate 33 are formed. The recesses 39 may have a structure filled with Cu, any other metal, or a material resistant to a temperature of approximately 350° C.

Figure 14A:
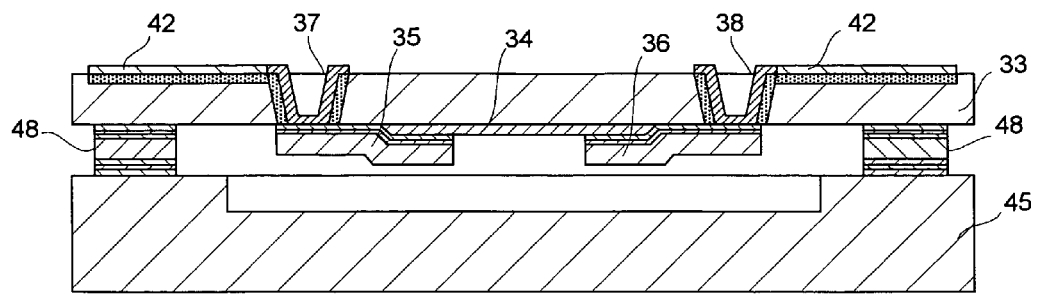
FIG. 14A, FIG. 14B, and FIG. 14C are sectional views showing the manufacturing process of the midair semiconductor device subsequent to FIG. 13D.
Figure 14B:
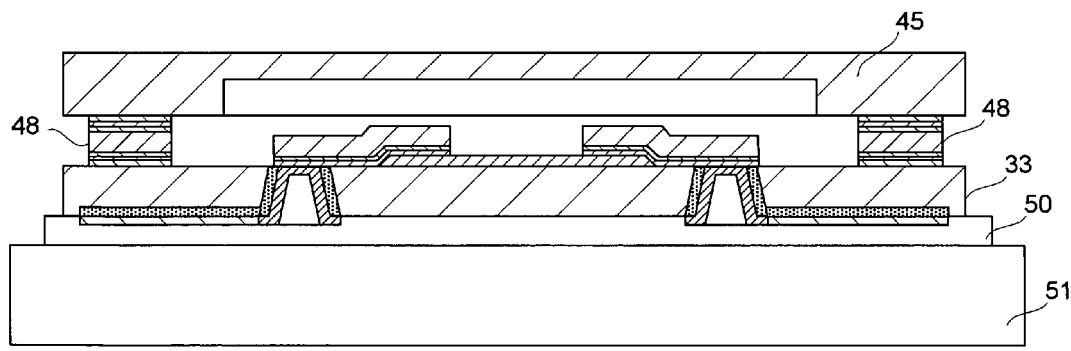

Then, as shown in FIG. 14A, the wiring layers 42 connected to the connection plugs 37 and 38 are formed. Further, as shown in FIG. 14B, after the rear surface side of the Si substrate 33 is bonded to the support substrate 51 represented by the glass substrate via the adhesive 50, the rear surface side of the cap substrate 45 is finished by grinding to a predetermined thickness. When bonding is performed wafer by wafer or in plural units, blade dicing or the like is performed after finishing of the cap substrate 45, so that individual packages (midair semiconductor devices 30) are separated.

Figure 14C:
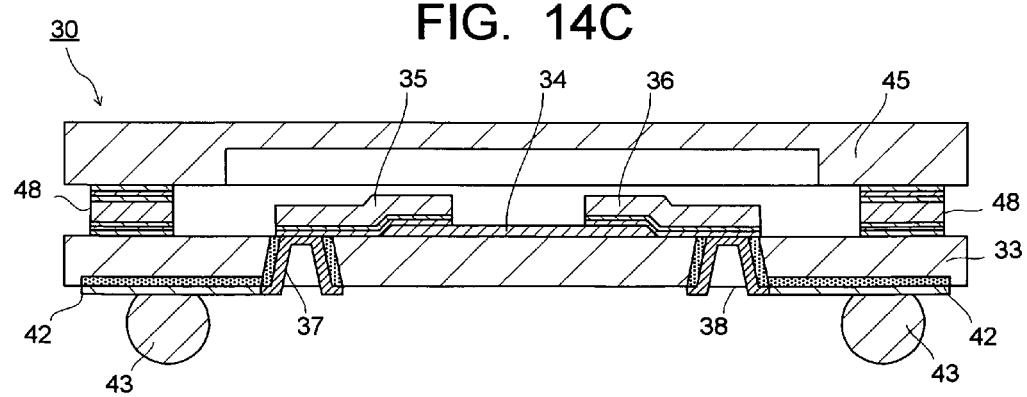

When solder bumps are used as the external connection terminals 43, for example, as shown in FIG. 14C, the solder bumps are formed on the wiring layers 42 after both the surfaces are ground. The cap substrate (Si cap) 45 which is previously ground to a predetermined thickness may be bonded to the Si substrate 33, but the above-described grinding after bonding is more favorable for preventing fracture and so on caused by handling.

Figure 15:
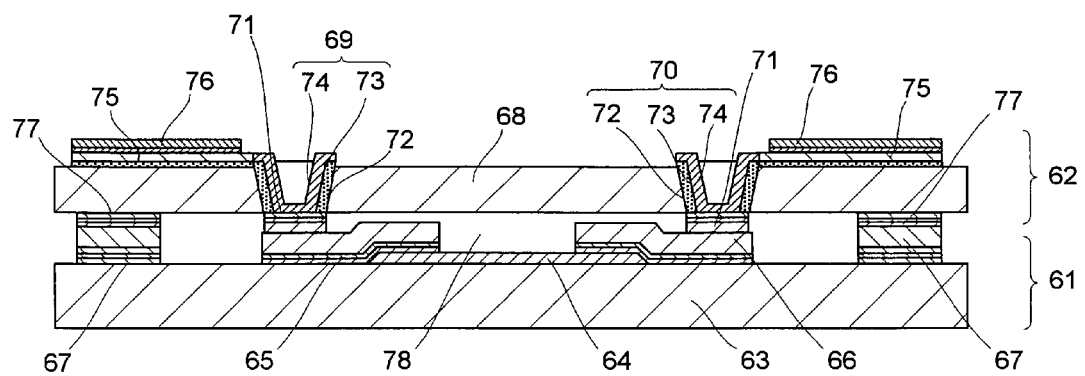
FIG. 15 is a sectional view showing a structure of a midair semiconductor device according to a fourth embodiment of the present invention.
Figure 16:
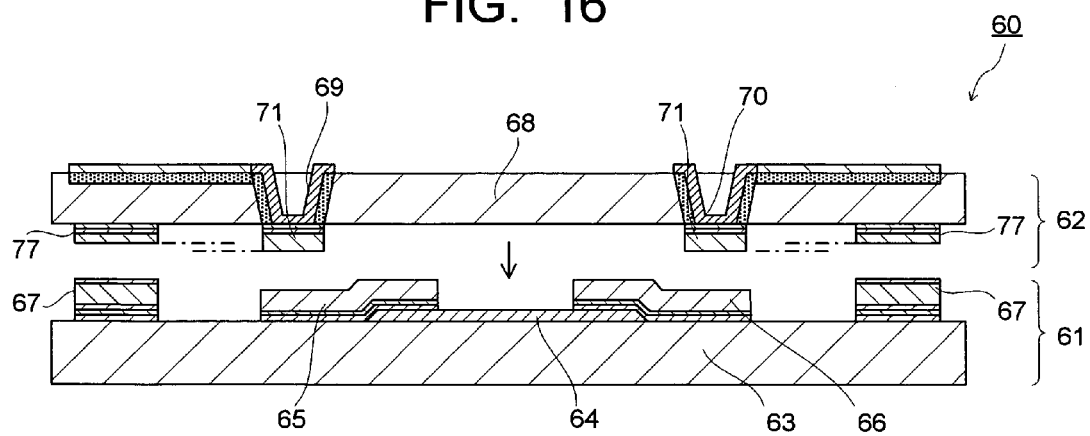
FIG. 16 is a sectional view showing a manufacturing process of the midair semiconductor device shown in FIG. 15.
Figure 17:
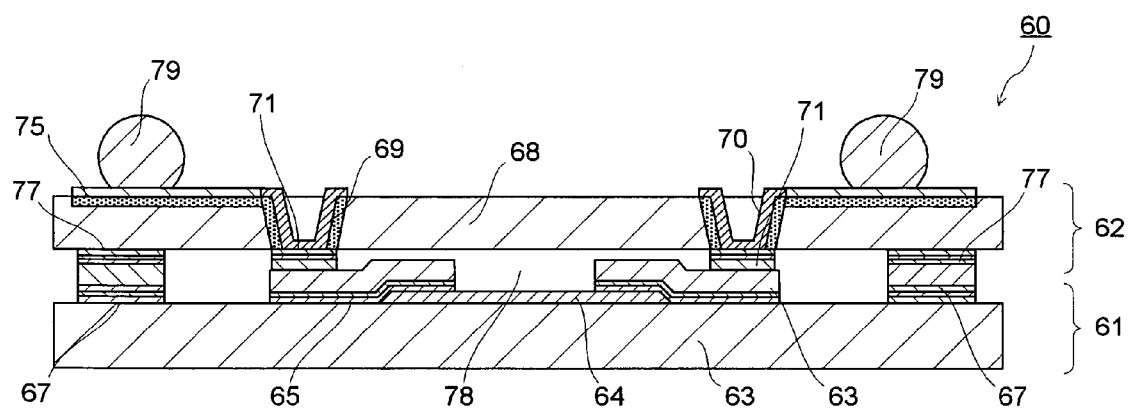
FIG. 17 is a sectional view showing a modified example of the midair semiconductor device shown in FIG. 15.

Next, the fourth embodiment of the present invention will be described with reference to FIG. 15 to FIG. 17. A midair semiconductor device 60 of the fourth embodiment shown in FIG. 15 includes an element structure part 61 and a cap part 62. The element structure part 61 includes a Si substrate 63 as an element semiconductor substrate, and an element part 64 is formed on a front surface of the Si substrate 63. As an example of the element part 64, a filter element such as an FBAR filter or a MEMS is shown. Electrodes 65 and 66 are connected to the element part 64. Further, on the front surface side of the Si substrate 63, an element-side metal sealing part 67 is formed so as to surround the element part 64 and the electrodes 65 and 66. The element part 64, the electrodes 65 and 66, and the element-side metal sealing part 67 are formed on the same surface of the Si substrate 63.

The electrodes 65 and 66 and the element-side metal sealing part 67 are made of a first metal material of the same kind. A metal material (Au, for example) which constitutes a low-melting metal (Au—Sn eutectic alloy, for example) in combination with later-described connection pads and metal sealing part of the cap part 62 is used as the first metal material. These electrodes 65 and 66 and element-side metal sealing part 67 each include an Au layer, for example, formed on the Si substrate 63 with a base metal film such as a barrier metal layer therebetween. Incidentally, an insulating film such as a Si oxide film is placed between the base metal films of the electrodes 65 and 66 and the element-side sealing part 67 and the Si substrate 63. The element structure part 61 is composed of these respective components.

On the other hand, the cap part 62 includes a cap substrate 68 for sealing such that a portion above the element part 64 is brought into a midair state. The Si substrate, for example, is used as the cap substrate 68, but the cap substrate 68 is not limited to this, and a glass substrate or the like can also be used. The cap substrate 68 may have a cavity. Such a cap substrate 68 is provided with connection plugs 69 and 70 as through electrodes. The connection plugs 69 and 70 are formed at positions in contact with the electrodes 65 and 66 provided on the front surface of the Si substrate 63, and a connection pad 71 is provided on a contact surface with each of the electrodes 65 and 66.

The connection plugs 69 and 70 each have a conductor layer (Cu layer, for example) 74 which is formed in a through hole 72 provided in the cap substrate 68 with an insulating film such as a Si oxide film 73 therebetween. The through hole 72 may be filled with the conductor layer 74. The connection pads 71 are each provided on a bottom of the conductor layer 74 formed in the through hole 72 and compose parts which connect with the electrodes 65 and 66. Further, wiring layers 75 electrically connected to the connection plugs 69 and 70 are formed on an outer surface (a surface on the side opposite to a surface facing the element part 64) of the cap substrate 68, and external connection terminals are provided on the wiring layers 75.

The wiring layer 75 includes a Cu layer formed, for example, on the cap substrate 68 with a base metal film such as a barrier metal film therebetween. The external connection terminal 76 includes a land made of an Au plated layer or the like. Here, the lands on which the midair semiconductor device 60 can be directly mounted are shown as the external connection terminals 76. The land as the external connection terminal 76 may be composed of an Au plated surface itself, or may be composed of a solder layer of Sn—Pb or the like which is formed on the surface of the Au plated layer by coating or plating. Incidentally, the external connection terminals 76 may be formed so as to directly connect with the connection plugs 69 and 70.

On a periphery of the cap substrate 68, a cap-side metal sealing part 77 is formed at a position in contact with the element-side metal sealing part 67. The cap-side metal sealing part 77 is made of a second metal material of the same kind as the connection pads 71. A metal material which constitutes a low-melting metal in combination with the first metal material (constituent material for the electrodes 65 and 66 and the element-side metal sealing part 67) is used as the second metal material. A typical example of the low-melting metal (low-melting alloy, for example) is the above-described Au—Sn eutectic alloy. The second metal material is not limited to this example, and a low-melting alloy whose eutectic point is approximately between 200° C. and 350° C. can be used.

As described above, when Au is used as the first metal material being the constituent material for the electrodes 65 and 66 and the element-side metal sealing part 67, Sn or an Au—Sn alloy is used as the second metal material being the constituent material for the connection pads 71 and the cap-side metal sealing part 77. They are formed by the plating method, the sputtering method, the deposition method, or the like. When Au is used as the first metal material and Sn is used as the second metal material, the thicknesses of respective layers are controlled so that the ratio between Au and Sn at a contact portion thereof is, for example, Au-about 20 mass % Sn. Incidentally, the first metal material and the second material may be reversed between the element side and the cap side, or the Au—Sn alloy layer can be used for both sides.

In all cases, the electrodes 65 and 66 and the element-side metal sealing part 67 are formed of a metal material of the same kind, and the connection pads 71 and the cap-side metal sealing part 77 are formed of a metal material of the same kind. Moreover, the electrodes 65 and 66 and the element-side metal sealing part 67 are deposited at the same time, and the connection pads 71 and the cap-side metal sealing part 77 are deposited at the same time. Consequently, the thicknesses of the first and second metal material layers are made uniform, respectively. Accordingly, the contact between the electrodes 65 and 66 and the connection pad 71, and the contact between the metal sealing parts 67 and 77 can be simultaneously improved. This is important for the purpose of improving both the electrical connection reliability between the element part 64 and the external connection terminals 75 and the hermeticity of a sealed space formed above the element part 64.

Then, by bonding the electrodes 65 and 66 and the connection pads 71, the element part 64 and the external connection terminals 75 are electrically connected, and simultaneously by bonding the element-side metal sealing part 67 and the cap-side metal sealing part 77, the element part 64 is hermetically sealed with the cap substrate 68. These bonding between the electrodes 65 and 66 and the connection pads 61 and bonding between the element-side and cap-side metal sealing parts 67 and 77 are performed at the same time. By this bonding process, the electrodes 65 and 66 provided on the front surface side of the Si substrate 63 and the external connection terminals 76 provided on the cap substrate 68 are electrically connected via the connection plugs 69 and 70 provided as the through holes in the cap substrate 68. Further, a hermetic sealed space 78 is formed above the element part 64.

As described above, the electrodes 65 and 66 and the element-side metal sealing part 67, and the connection pads 71 and the cap-side metal sealing part 77 are respectively formed out of the same kinds of metal materials and by simultaneous deposition. Therefore, the contact between the electrodes 65 and 66 and the connection pads 71 and the contact between the element-side metal sealing part 67 and the cap-side metal sealing part 77 can be improved at the same time. As a result, when the cap substrate 68 is bonded, the electrical connection reliability between the element part 64 and the external connection terminals 75 as well as the hermeticity of the sealed space 78 formed above the element part 64 can be improved.

Namely, the hermeticity and electrical connection reliability of the midair semiconductor device 60 can be improved simultaneously. As just described, to improve the hermeticity and the electrical connection reliability simultaneously, it is important to form the electrodes 65 and 66 and the element-side metal sealing part 67, and the connection pads 71 and the cap-side metal sealing part 77 respectively out of the same kinds of metal materials and by simultaneous deposition.

Further, it is desirable that the connection pads 71 provided at tips of the connection plugs 69 and 70 be formed so as to project further than the cap-side metal sealing part 77. The structure in which the connection pads 71 project can be obtained based on the layer structure or layer thickness of the connection plugs 69 and 70. Alternatively, the connection pads 71 can project by changing the thickness of the connection pads 71. As just described, by using the cap part 62 having the structure in which the connection pads 71 project further than the cap-side metal sealing part 77, the electrical connection reliability between the element part 64 and the external connection terminals 75 can be further improved.

For example, a case where Au is used for the electrodes 65 and 66 and the element-side metal sealing part 67 and Sn is used for the connection pads 71 and the cap-side metal sealing part 77 will be considered. If the Si substrate 63 and the cap substrate 68 are precisely aligned opposite each other and then brought into contact with each other while their parallel state is maintained, the connection pads 71 are brought into contact earlier. Since in the process of bonding under pressure while heating, the melting point of Sn composing the connection pads 71 is 232° C., the connection pads 71 start to react with Au composing the electrodes 65 and 66 on the Si substrate 63 side earlier than the metal sealing part 77. When elastic deformation of the electrodes 65 and 66 by further application of pressure starts, Sn of the cap-side metal sealing part 77 is brought into contact with Au of the element-side metal sealing part 67, and simultaneously, Sn starts to melt, and diffusion into Au progresses.

Then, by heating to a temperature exceeding 280° C. which is an Au—Sn eutectic point, the bonding between the electrodes 65 and 66 and the connection pads 71 and the bonding between the element-side and the cap-side metal sealing parts 67 and 77 can be enhanced simultaneously. Although the example in which alloying is made by bonding between Au and Sn is shown so far, the same effect can be obtained even if previously alloyed Au—Sn is used. Further, in place of the Au—Sn eutectic alloy, any other low-melting alloy with an eutectic point between 200° C. and 3500 can be used.

Incidentally, in the above-described embodiments, the midair semiconductor device 60 including the lands formed out of an Au plating layer or the like as the external connection terminals 76 is described, but connection with an external substrate may be established by wire bonding. Further, the external connection terminal may be a metal bump 79 such as a solder ball, an Au plated bump, or an Au stud bump as shown in FIG. 17. Furthermore, a conductive resin bump can also be used. As just described, the midair semiconductor device 60 can be applied to any of an LGA structure, a BGA structure, and a wire bonding structure.

Next, an embodiment of a manufacturing method of a midair semiconductor device of the present invention will be described. When the midair semiconductor device according to each of the above-described embodiments is fabricated, the bonding between the element semiconductor substrate and the cap substrate can be performed on a wafer-by-wafer basis, on a block-by-block basis, plural elements being lumped together as one block, or an element-by-element basis. In order to increase the efficiency of manufacturing the midair semiconductor device and reduce the manufacturing cost, bonding on a wafer-by-wafer basis is desirable. However, if both the element semiconductor substrate and the cap substrate are bonded on a wafer-by-wafer basis, there is a possibility that the hermetic sealing performance partially deteriorates. Hence, it is desirable to prepare the element semiconductor substrate in a wafer state and bond individually separated cap substrates to respective element parts formed on the element semiconductor substrate.

Figure 18A:
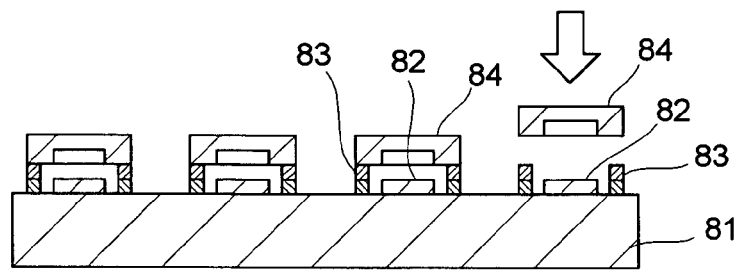
FIG. 18A, FIG. 18B, and FIG. 18C are sectional views showing a manufacturing process of a midair semiconductor device according to an embodiment of the present invention.

A manufacturing process of such a midair semiconductor device will be described with reference to FIG. 18A to FIG. 18C. First, as shown in FIG. 18A, plural element parts (including an electrode and a connection plug and the like as necessary) 82 and sealing parts 83 surrounding them are formed on the front surface side of a semiconductor wafer (Si wafer) 81 which becomes an element semiconductor substrate according to their respective element forming regions. Then, cap substrates (for examples, Si caps) 84 which are individually separated corresponding to shapes of the respective element parts 82 are arranged and bonded by thermocompression. The cap substrate 84 includes a connection plug and the like as necessary. The structure of each part, the process of bonding between the semiconductor wafer 81 and the cap substrates 84, and the like are as shown in the above-described respective embodiments.

Figure 18B:
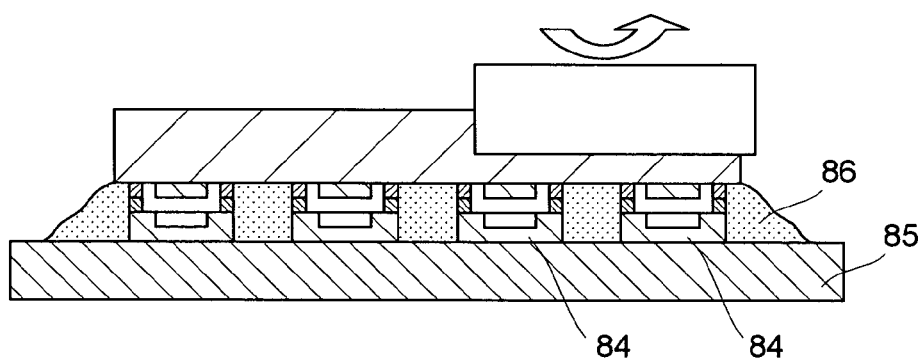

Subsequently, as shown in FIG. 18B, the semiconductor wafer 81 to which the plural cap substrates 84 are bonded is mounted on a support substrate 85 represented by a glass substrate in such a manner that a rear surface thereof is exposed. At this time, the plural cap substrates 84 are bonded to the support substrate 85 via a resin protectant 86 so that irregularities caused by the plural cap substrates 84 are absorbed. In this state, the rear surface side of the semiconductor wafer 81 is ground to a predetermined thickness. Even if the heights of the plural cap substrates 84 differ slightly depending on the bonding state, the rear surface machining of the semiconductor wafer 81 can be performed in the same manner as a normal wafer since the irregularities caused by the plural cap substrates 84 are absorbed by the resin protectant 86.

Figure 18C:
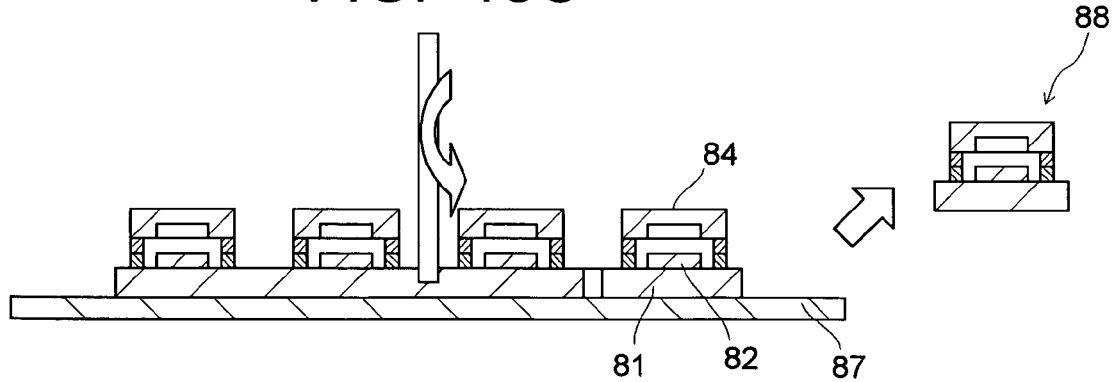

Thereafter, as shown in FIG. 18C, the semiconductor wafer 81 is diced according to the respective element parts 82 while a ground surface (rear surface) of the semiconductor wafer 81 is mounted on a dicing tape 87. Thereby, individually separated midair semiconductor devices 88 are fabricated. According to this manufacturing process of the midair semiconductor device 88, the manufacturing efficiency can be increased by using machining on a wafer-by-wafer basis while deterioration in hermetic sealing performance is suppressed.

It is to be understood that the present invention is not intended to be limited to the above-described respective embodiments, and can be applied to various kinds of midair semiconductor devices which need a hermetically sealed space above an element part. Such midair semiconductor devices and manufacturing methods thereof are also included in the present invention. The embodiments of the present invention can be enlarged or changed within the scope of the technical idea of the present invention, and the enlarged or changed embodiments are also included in the technical scope of the present invention.

What is claimed is:

1. A method for manufacturing a midair semiconductor device, comprising:
    forming a plurality of element parts on a front surface side of a semiconductor substrate;
    bonding a plurality of individually separated cap parts to the semiconductor substrate, respectively, in such a manner that the plurality of element parts are sealed individually;
    bonding the semiconductor substrate to a support substrate via a resin protectant which absorbs irregularities caused by the plurality of cap parts;
    machining a rear surface of the semiconductor substrate bonded to the support substrate; and
    cutting the machined semiconductor substrate, according to the plurality of element parts to fabricate a midair semiconductor device in which the element part is sealed with the cap part.

* * * * *